United States Patent
Cornils et al.

(10) Patent No.: US 11,125,838 B2
(45) Date of Patent: Sep. 21, 2021

(54) SEMICONDUCTOR SENSOR STRUCTURE

(71) Applicant: TDK-MICRONAS GMBH, Freiburg (DE)

(72) Inventors: Martin Cornils, Freiburg (DE); Maria-Cristina Vecchi, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 92 days.

(21) Appl. No.: 16/742,446

(22) Filed: Jan. 14, 2020

(65) Prior Publication Data
US 2020/0256931 A1 Aug. 13, 2020

(30) Foreign Application Priority Data
Jan. 14, 2019 (DE) .................... 10 2019 000 165.6

(51) Int. Cl.
*G01R 33/07* (2006.01)
*G01R 33/00* (2006.01)
*G01R 33/02* (2006.01)

(52) U.S. Cl.
CPC ....... *G01R 33/072* (2013.01); *G01R 33/0005* (2013.01); *G01R 33/0206* (2013.01)

(58) Field of Classification Search
CPC .............. G01R 33/072; G01R 33/0005; G01R 33/0206
See application file for complete search history.

(56) References Cited

U.S. PATENT DOCUMENTS

| 9,494,661 | B2* | 11/2016 | Paul .................... G01R 33/0206 |
| 9,935,259 | B2* | 4/2018 | Kolb ....................... H01L 43/04 |
| 2012/0169329 | A1* | 7/2012 | Hellwig ................. G01R 33/07 324/251 |
| 2016/0003923 | A1* | 1/2016 | Zieren ..................... H01L 43/08 324/252 |

(Continued)

FOREIGN PATENT DOCUMENTS

DE 10 2013 209 514 A1 11/2014

OTHER PUBLICATIONS

Sander et al., "Isotropic 3D Silicon Hall Sensor," IEEE Int'l Conference on MEMS, pp. 838-896 (Jan. 2015).

(Continued)

*Primary Examiner* — Alesa Allgood
(74) *Attorney, Agent, or Firm* — Muncy, Geissler, Olds & Lowe, P.C.

(57) ABSTRACT

A semiconductor sensor structure is provided which has a top side and a bottom side and includes a first semiconductor wafer, a second semiconductor wafer, and an insulating layer. The second semiconductor wafer includes a substrate layer having an integrated circuit, formed on the front side, with at least one metal terminal contact formed on the front side. The front side of the second semiconductor wafer and a front side of the first semiconductor wafer are each formed on the insulating layer. The first semiconductor wafer has a semiconductor layer with a three-dimensional Hall sensor structure having a sensor area formed of a monolithic semiconductor body and extending from the backside to the (Continued)

front side of the semiconductor layer. At least three mutually spaced apart first metal terminal contacts are on the front side and at least three mutually spaced apart second metal terminal contacts are on the backside.

12 Claims, 3 Drawing Sheets

(56) References Cited

U.S. PATENT DOCUMENTS

2017/0138988 A1\* 5/2017 Ausserlechner ..... G01R 15/202

OTHER PUBLICATIONS

Sander et al., "Monolithic Isotopic 3D Silicon Hall Sensor," Sensors and Actuators A: Physical, vol. 247, pp. 587-597 (2016).
Garrou et al., Handbook of 3D Integration, vol. 1, Chapters 3 and 12, pp. 25-44 and 223-248 (2008).
U.S. Appl. No. 16/742,365, filed Jan. 14, 2020.

\* cited by examiner

SEMICONDUCTOR SENSOR STRUCTURE

This nonprovisional application claims priority under 35 U.S.C. § 119(a) to German Patent Application No. 10 2019 000 165.6, which was filed in Germany on Jan. 14, 2019, and which is herein incorporated by reference.

BACKGROUND OF THE INVENTION

Field of the Invention

The present invention relates to a semiconductor sensor structure and a semiconductor sensor structure manufacturing method, wherein the semiconductor sensor structure comprises a first semiconductor wafer and a second semiconductor wafer.

Description of the Background Art

A three-dimensional Hall sensor for detecting a spatial magnetic field is known from DE 10 2013 209 514 A1, which corresponds to U.S. Pat. No. 9,494,661, which is incorporated herein by reference, wherein a semiconductor body has at least three electrode pairs, each electrode pair comprises a first terminal on a top side of the semiconductor body and a second terminal on a bottom side of the semiconductor body, and at least three pairs of electrode pairs form at least three four-contact structures, each of which enable the measurement of a spatial component of the magnetic field using the Hall effect.

A structure comprising a 3D Hall sensor structure on a circuit board is known from "Isotropic 3D Silicon Hall Sensor," Christian Sander et al., 28th IEEE Int. Conference on MEMS, 2015, 893-896 and from "Monolithic Isotropic 3D Silicon Hall Sensor," Christian Sander et al, Sensors and Actuators A, Vol. 247, 2016, 587-597.

Various methods for stacking ICs are known from "Handbook of 3D integration: technology and applications of 3D integrated circuits," P. Garrou et al., Vol. 1, Weinheim: Wiley, 2008, pp. 25-44 and pp. 223-248, Chapters 3 and 12, ISBN 978-527-32034-9, wherein the ICs are joined over their entire surface and connected by via contact through holes.

SUMMARY OF THE INVENTION

It is therefore an object of the present invention to provide a device that further refines the prior art.

According to an exemplary embodiment of the invention, a semiconductor sensor structure is provided which has a top side and a bottom side comprising a first semiconductor wafer, a second semiconductor wafer, and an insulating layer.

The first semiconductor wafer has a semiconductor layer of a second conductivity type with a buried front side and a backside forming the top side.

The second semiconductor wafer comprises a substrate layer having a backside, forming a bottom side, and a buried front side and an integrated circuit, formed on the front side, with at least one metal terminal contact formed on the front side. Preferably, the integrated circuit has a plurality of metal terminal contacts.

The front side of the first semiconductor wafer and the front side of the second semiconductor wafer are each formed on the insulating layer.

A three-dimensional Hall sensor structure having a sensor area is formed in the semiconductor layer of the first semiconductor wafer, wherein the sensor area formed of a monolithic semiconductor body, extending from the backside to the front side of the silicon semiconductor wafer, and at least three mutuallly spaced apart first metal terminal contacts are formed in the region of the semiconductor body on the front side and at least three mutuallly spaced apart second metal terminal contacts are formed on the backside.

In a projection perpendicular to the front side, the first terminal contacts are arranged offset relative to the second terminal contacts, wherein each first terminal contact and each second terminal contact are formed on a heavily doped semiconductor contact area of a second conductivity type and the first terminal contacts and the second terminal contacts each have a multiple rotational symmetry in each case with respect to an axis of symmetry standing vertically on the front side and backside of the semiconductor body.

The at least three first metal terminal contacts of the Hall sensor structure and the at least one terminal contact of the integrated circuit are each electrically connected from the backside of the first semiconductor wafer or from the backside of the second semiconductor wafer.

The first terminal contacts can be arranged offset relative to the second terminal contacts, because the associated heavily doped semiconductor contact areas of the first terminal contacts are arranged offset relative to the associated heavily doped semiconductor contact areas of the second terminal contacts.

The front side of the first semiconductor wafer can be arranged on the front side of the second semiconductor wafer and the two semiconductor wafers are connected via a wafer bond to the semiconductor sensor structure.

At least one metal terminal contact of the integrated circuit is electrically connected to a first or second terminal contact of the Hall sensor structure, so that an electrical operative connection is formed between the Hall sensor structure and the integrated circuit.

It should be noted that an isotropic Hall sensor can be understood to mean a so-called 3D or three-dimensional Hall sensor structure which has a continuous extent within the semiconductor body in all three spatial directions and wherein all three components of a magnetic field can be determined by means of the Hall sensor structure.

The formation of the heavily doped semiconductor contact areas can take place by means of an implantation step, the dose being above $10e15$ N/cm$^2$.

Thus, a 3D Hall sensor wafer and a further wafer comprising an integrated circuit, e.g., in accordance with CMOS technology, are combined in the semiconductor sensor structure, wherein the two wafers or semiconductor wafers are connected to one another by means of a wafer bond. As a result, compact and very sensitive Hall sensors can be produced inexpensively and reliably.

The first terminal contacts of the Hall sensor structure are brought out of the sensor area in a direction parallel to the front side of the semiconductor layer, as a result of which a contacting from the backside of the first semiconductor wafer by means of through-silicon vias outside the sensor area is possible. Terminal contacts of the integrated circuit, which are connected from the backside of the first semiconductor wafer, are also arranged in a projection perpendicular to the backside of the semiconductor layer outside the sensor area or at least brought out of the sensor area.

The semiconductor sensor structure of the invention represents a monolithic embodiment of an isotropic Hall sensor, which can be manufactured in CMOS technology. The component becomes particularly compact due to the integration with circuit technology.

The semiconductor body can be electrically insulated from the rest of the semiconductor layer by means of a circumferential trench structure.

The trench structure, which can also be referred to as a trench, can be arranged spaced apart from the first terminal contacts and the second terminal contacts. Although it is understood that the semiconductor body or the sensor structure is indeed electrically insulated from the rest of semiconductor layer, the first terminal contacts and the second terminal contacts can be connected to the integrated circuit via traces.

The depth of the trench structure can be formed such that the trench structure cuts through the semiconductor layer. In other words, the depth of the trench structure corresponds to the thickness of the semiconductor layer. The trench structure preferably has a SiO2 layer on the side walls over the entire surface. A doped polysilicon is preferably formed between the side walls, wherein the polysilicon is expediently connected to a reference potential.

The semiconductor body or the sensor area can be designed as, for example, a hexagonal prism. Also, the semiconductor body can have different shapes.

The semiconductor body in the sensor area can have a thickness of between 2 µm and 50 µm or of between 2 µm and 30 µm. In the sensor area, the ratio of the thickness to length of the semiconductor body preferably comprises a range of between 0.6 to 1.4 or a range of between 0.8 to 1.2. The thickness of the semiconductor body can be constant at least within the sensor area. For example, the surface on the front side of the semiconductor body to the surface on the backside, at least in the region of the sensor area, can be formed flat and almost completely or completely parallel to one another. Almost completely can mean, for example, a value above 90%.

The second terminal contacts of the Hall sensor structure comprise a heavily doped polysilicon of a second conductivity type.

The semiconductor layer can have regions of a first conductivity type outside the Hall sensor structure.

The first conductivity type can be a p type and the second conductivity type can be an n type or vice versa.

The first terminal contacts of the Hall sensor structure and the terminal contacts of the integrated circuit can each have a diameter of at least 10 µm or at least 20 µm or at least 80 µm.

The first terminal contacts of the Hall sensor structure and the terminal contacts of the integrated circuit can each be connected by means of a through-silicon via from the backside of the first semiconductor wafer or from the backside of the second semiconductor wafer.

A semiconductor sensor structure manufacturing method comprising a first semiconductor wafer, a second semiconductor wafer, and an insulating layer of the type described above comprises at least the following process sections:

In a first process section area, at least three heavily doped first semiconductor contact areas of the second conductivity type are produced by implantation on a first semiconductor wafer, having a semiconductor layer of a second conductivity type with a front side and a backside, in a plurality of process steps on the front side and a first terminal contact is arranged on each contact area.

In a second process section area, an integrated circuit having at least one metal terminal contact on the front side is produced on a second semiconductor wafer, having a substrate layer with a backside and a front surface, in a plurality of process steps on the front side.

In a third process section area, the front side of the first semiconductor wafer is joined to the front side of the second semiconductor wafer, wherein, after the joining, the insulating layer is formed between the first semiconductor wafer and the second semiconductor wafer, such that due to the joining, the backside of the first semiconductor wafer becomes a top side of the semiconductor sensor structure and the backside of the second semiconductor wafer becomes a bottom side of the semiconductor sensor structure and the front side of the first semiconductor wafer and the front side of the second semiconductor wafer each become a buried surface.

In a fourth process section area, the backside of the first semiconductor wafer is thinned. After thinning, at least three heavily doped second semiconductor contact areas of the second conductivity type are produced by implantation in a plurality of process steps on the thinned backside, and a second terminal contact is arranged on each contact area, wherein in a projection perpendicular to the front side, the first heavily doped semiconductor contact areas are offset relative to the second heavily doped semiconductor contact areas, and the first semiconductor contact areas and the second semiconductor contact areas each have a multiple rotational symmetry with respect to an axis of symmetry standing vertically on the front side and backside of the semiconductor body.

The designations "first process section area," "second process section area," etc., do not specify a time sequence.

The fourth process section area can be carried out before or after the third process section area.

In a fifth process section area, a trench structure completely surrounding the sensor area can be formed on the backside of the semiconductor layer.

A doped polysilicon can be deposited and patterned during the first process section area for connecting the heavily doped contact areas to the first terminal contacts.

The patterned polysilicon can be covered by a dielectric.

In a sixth process section area, in a part of the first semiconductor wafer, lying outside the sensor area, and in a projection perpendicular to the backside of the first semiconductor wafer, in each case above the first terminal contacts of the Hall sensor structure and above the terminal contacts of the integrated circuit, a trench can be formed extending from the backside of the first semiconductor wafer to the respective terminal contact and filled with an electrically conductive material.

Further, in a part of the first semiconductor wafer, lying outside the sensor area, and in a projection perpendicular to the backside of the second semiconductor wafer, in each case below the first terminal contacts of the Hall sensor structure and below the terminal contacts of the integrated circuit, a trench is formed extending from the backside of the second semiconductor wafer to the respective terminal contact and filled with an electrically conductive material.

In the fourth process section area, a semiconductor layer having a thickness of between 2 µm and 50 µm or of between 5 µm and 30 µm or having a thickness of less than 100 µm can be formed by, for example, a CMP process.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
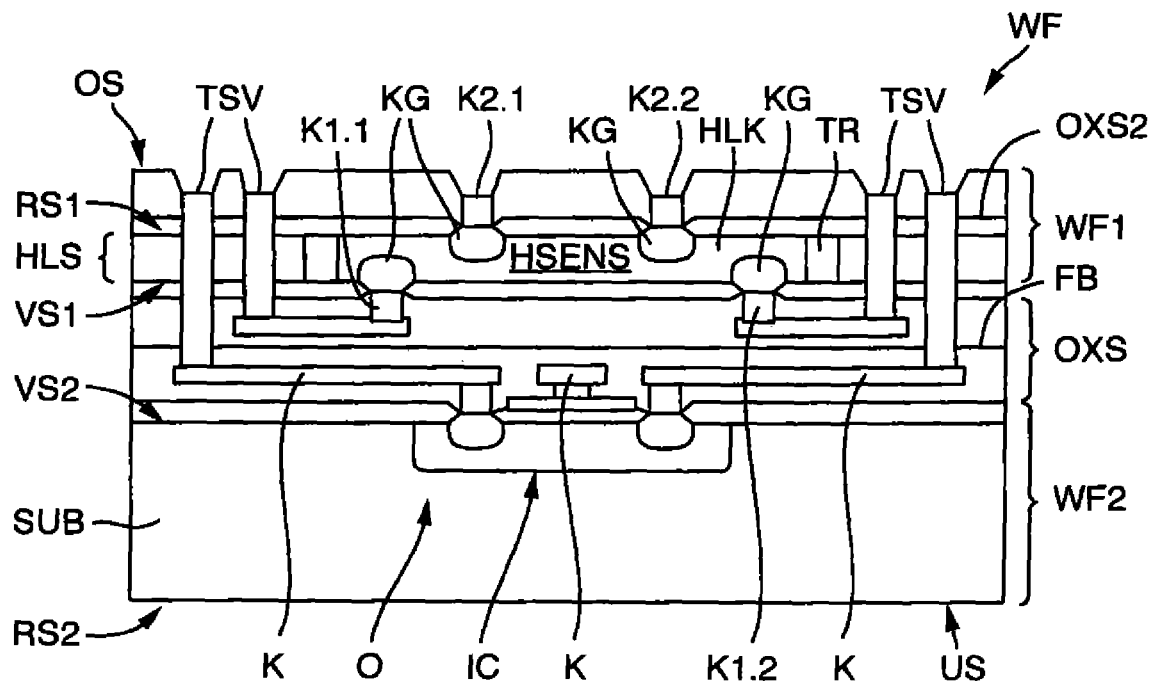
FIG. 1 shows a schematic sectional view of an exemplary embodiment of the invention of a semiconductor sensor structure.
Figure 2:
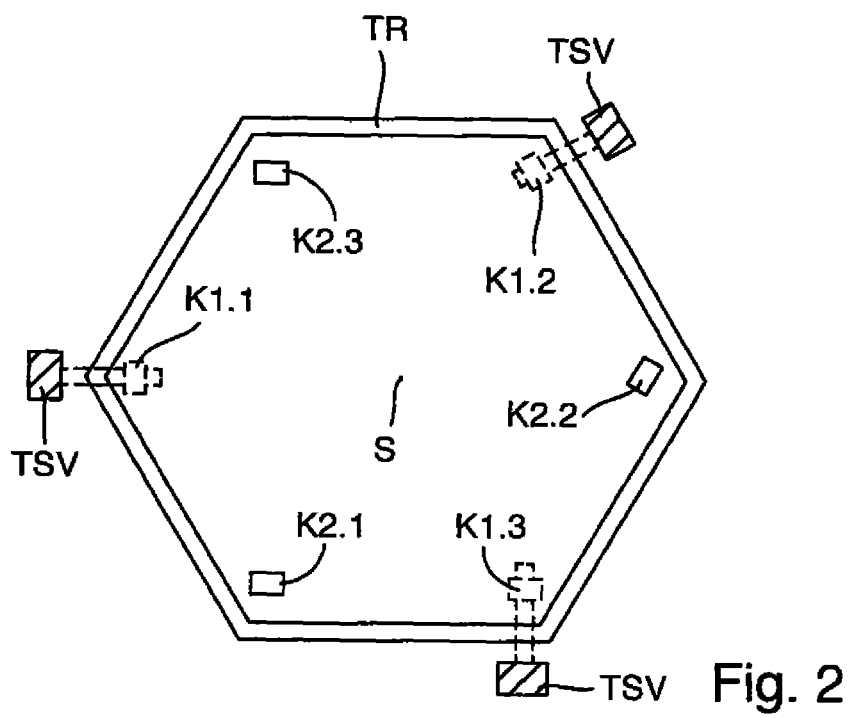
FIG. 2 shows a schematic top view of the semiconductor structure.

The drawings in FIGS. 1 and 2 show a sectional view or a top plan view, respectively, of a first embodiment of a semiconductor sensor structure WF of the invention comprising a first semiconductor wafer WF1, a second semiconductor wafer WF2, and an insulating layer OXS formed as an oxide layer. The surface FB to which the two semiconductor wafers WF1 and WF2 are joined runs within the insulating layer OXS.

The second semiconductor wafer WF2 has a substrate layer SUB, formed on a backside RS2, and an integrated circuit IC, for example, a transistor, formed on a front side VS2, with multiple metal terminal contacts K formed on the front side VS2.

The backside RS2 of the substrate layer SUB forms a bottom side US of the semiconductor sensor structure WF. The front side VS2 is covered by a first part of the insulating layer OXS except for a part of the terminal contacts K.

The first semiconductor wafer has a semiconductor layer HLS of a second conductivity type with a front side VS1 and a backside RS1. A three-dimensional Hall sensor structure HSENS having a sensor area is formed in the semiconductor layer HLS. The sensor area formed of a monolithic semiconductor body HLK extends from the backside RS1 to the front side VS1 of the semiconductor layer HLS. The semiconductor body HLK is electrically insulated from the rest of the semiconductor layer HLS by means of a circumferential trench structure TR and has a hexagonal cross section in the illustrated exemplary embodiment. According to alternative embodiments, the semiconductor layer HLS or the trench structure TR has, for example, a quadrangular or an octagonal cross section, whereby tests showed that the hexagonal cross section represents a preferred embodiment.

Three mutuality spaced apart first metal terminal contacts K1.1, K1.2, K1.3 are formed on the front side VS1 of the semiconductor layer HLS, and three mutuality spaced apart second metal terminal contacts K2.1, K2.2, K2.3 are formed on the backside RS1, wherein, in a projection perpendicular to the front side VS1, the first terminal contacts K1.1, K1.2, K1.3 are offset relative to the second terminal contacts K2.1, K2.2, K2.3. In addition, the first terminal contacts K1.1, K1.2, K1.3 on the front side VS1 and the second terminal contacts K2.1, K2.2, K2.3 on the backside RS1 each have a threefold rotational symmetry with respect to an axis of symmetry S standing vertically on the front side VS1 and backside RS1 of the semiconductor body HLK.

Each first terminal contact K1.1, K1.2, K1.3 and each second terminal contact K2.1, K2.2, K2.3 are formed on a heavily doped semiconductor contact area KG of a second conductivity type. It is understood that the heavily doped semiconductor contact areas assigned to the terminal contacts are arranged rotated relative to one another.

The semiconductor contact areas KG are arranged close to the trench structure TR and preferably in the corners of the hexagonal structure.

The front side VS1 is covered by a second part of the insulating layer OXS and the backside RS1 is covered by a further insulating layer OXS2, wherein the insulating layers OXS and OXS2 each only partially enclose the first and second terminal contacts K1.1, K1.2, K1.3, K2.1, K2.2, K2.3.

The first terminal contacts K1.1, K1.2, K1.3 of the Hall sensor structure HSENS and the terminal contacts K of the integrated circuit IC are brought out by means of through-silicon vias TSV to the top side OS of the semiconductor structure WF or connected from the top side OS of the semiconductor sensor structure WF.

Figure 3:
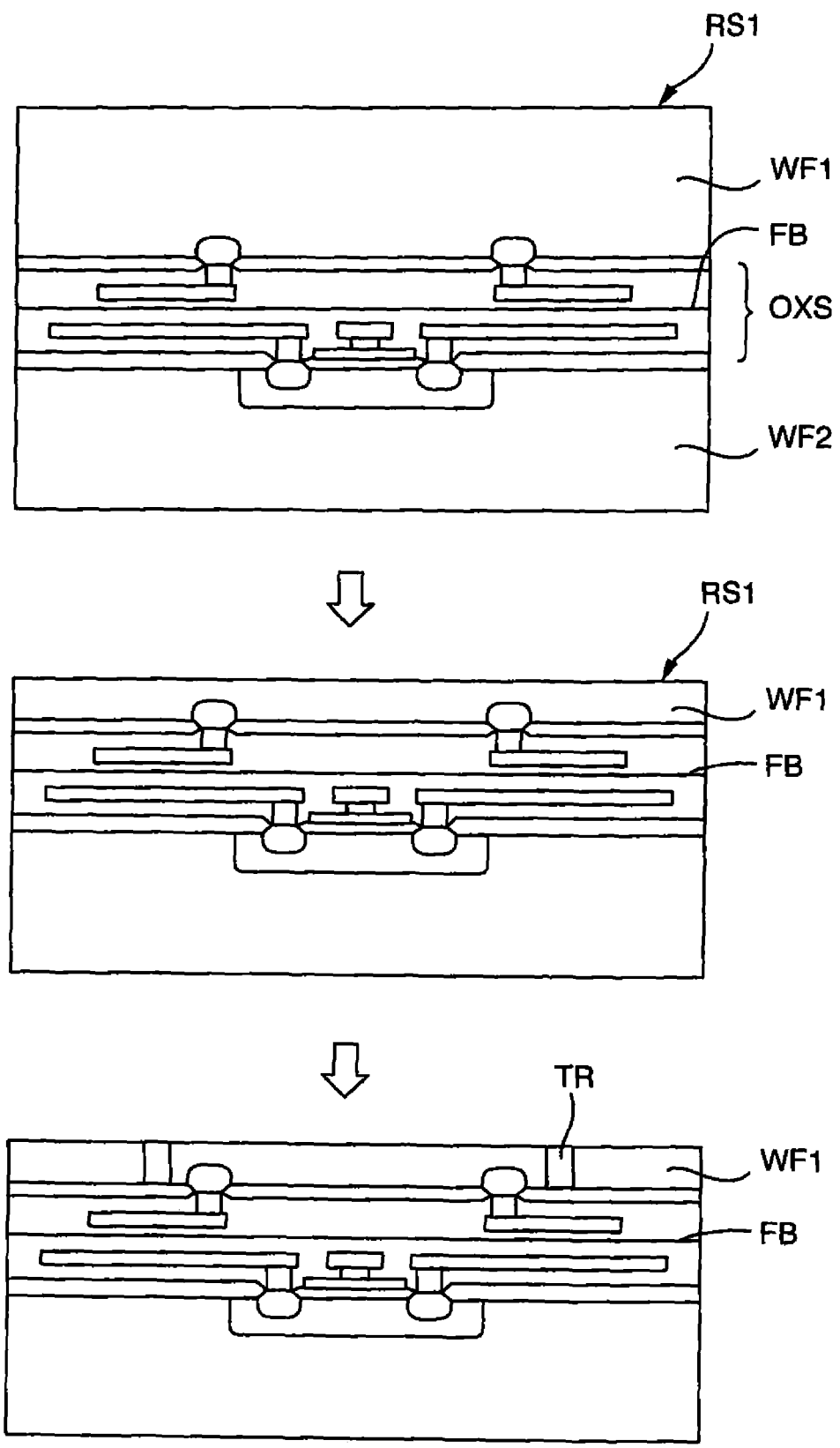
FIG. 3 shows a schematic view of a fourth and fifth process sections.

A first embodiment of the invention of a fourth process section area is shown in the illustration of FIG. 3. Only the differences from the illustration in FIG. 1 will be explained below.

After the second semiconductor wafer WF2 is produced, the heavily doped semiconductor contact areas KG on the front side VS1 of the first semiconductor wafer WF1 are produced, and the first terminal contacts K1.1, K1.2, K1.3 are arranged on the contact areas KG, the front side VS1 of the first semiconductor wafer is bonded to the front side VS2 of the second semiconductor wafer in a third process section area, wherein the insulating layer OXS between the two semiconductor wafers WF1 and WF2 is formed from two insulating sublayers applied in each case to the front side VS1 of the first semiconductor wafer WF1 and the front side VS2 of the second semiconductor wafer WF2.

Subsequently, in a fourth process section area, the semiconductor layer HLS of the first semiconductor wafer WF1 is thinned from the backside RS1.

Thereafter, a trench structure TR is generated extending from the backside RS1 of the semiconductor layer HLS of the first semiconductor wafer WF1 to the front side VS1 of the semiconductor layer HLS.

Figure 4:
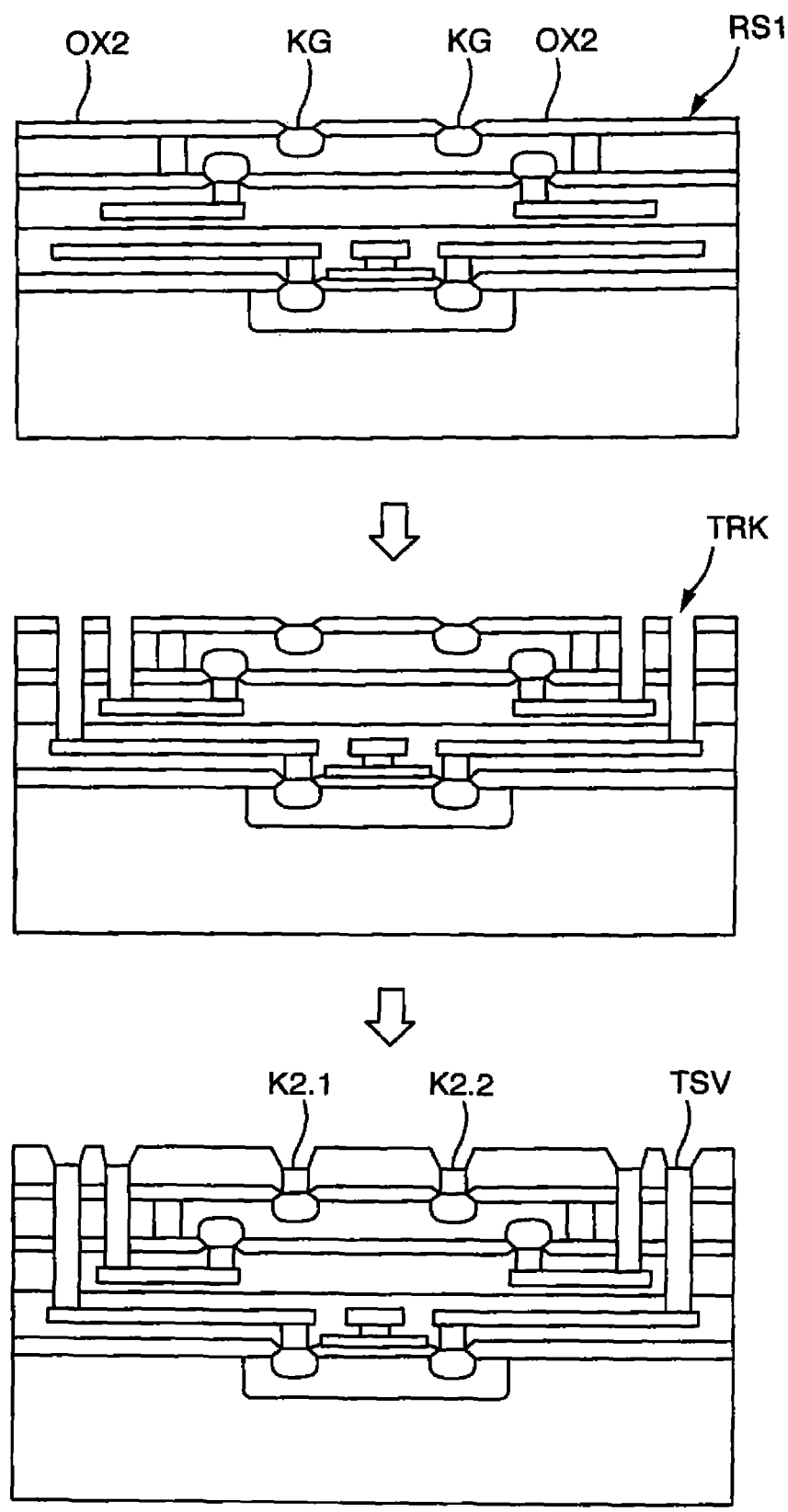
FIG. 4 shows a schematic view of a sixth process section.

Further process section areas of a first embodiment are shown in FIG. 4. Only the differences from the illustrations in FIGS. 1 and 3 will be explained below.

On the thinned backside RS1 of the first semiconductor wafer, heavily doped contact areas KG are produced in accordance with the first process section area.

Subsequently, for each first terminal contact K1.1, K1.2, K1.3 of the Hall sensor structure HSENS and the terminal contacts K of the integrated circuit, a trench TRK is generated extending from the backside RS1, or from a thin oxide layer formed on the backside RS1 up to the respective terminal contact K1.1, K1.2, and K1.3.

Thereafter, the second terminal contacts K2.1, K2.2, K2.3 are arranged on the heavily doped contact areas KG, a through-silicon via is produced in the trenches TRK, and a further insulating layer OXS2 is applied which leaves free the contacts K2.1, K2.2, and K2.3 and the through-silicon vias TSV.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor sensor structure comprising:
   a top side;

a bottom side comprising a first semiconductor wafer, the first semiconductor wafer having a semiconductor layer of a first conductivity type with a first buried front side and a backside, the backside of the first semiconductor wafer facing towards the top side of the semiconductor sensor structure;

a three-dimensional Hall sensor structure having a sensor area and formed in the semiconductor layer of the first semiconductor wafer, the sensor area having a monolithic semiconductor body extending from the backside to the first buried front side of the semiconductor layer;

at least three mutually spaced apart first terminal contacts formed of metal and formed in a region of the semiconductor body on a front side of the semiconductor body;

at least three mutually spaced apart second terminal contacts formed of metal and formed on a backside of the semiconductor body;

a second semiconductor wafer comprising a substrate layer having a backside forming a bottom side, a second buried front side, and an integrated circuit formed on the second buried front side, and at least one metal terminal contact formed on the second buried front side; and an insulating layer, wherein, in a projection perpendicular to the front side of the semiconductor body, the first terminal contacts are arranged offset relative to the second terminal contacts, wherein the first terminal contacts and second terminal contacts are formed on a heavily doped semiconductor contact area of the first conductivity type, wherein the first terminal contacts and the second terminal contacts have a multiple rotational symmetry in with respect to an axis of symmetry standing vertically on the front side and on the backside of the semiconductor body, wherein the semiconductor body is electrically insulated from the rest of the semiconductor layer via a circumferential trench structure, wherein the front side of the first semiconductor wafer and the front side of the second semiconductor wafer are each formed on the insulating layer, wherein the first terminal contacts of the Hall sensor structure and the terminal contacts of the integrated circuit are connected by a silicon through-viahole from the backside of the first semiconductor wafer, and wherein the silicon through-viahole is formed as a trench filled with an electrically conductive material and in a portion of the first semiconductor wafer lying outside the sensor area, and in a projection perpendicular to the backside of the first semiconductor wafer above the first terminal contacts of the Hall sensor structure and above the terminal contacts of the integrated circuit, extend from the backside of the first semiconductor wafer to the respective terminal contact.

2. The semiconductor sensor structure according to claim 1, wherein the second terminal contacts of the Hall sensor structure comprise a heavily doped polysilicon of the first conductivity type.

3. The semiconductor sensor structure according to claim 1, wherein the first terminal contacts of the Hall sensor structure and the terminal contacts of the integrated circuit each have a diameter of at least 10 µm or of at least 20 µm or of at least 80 µm.

4. The semiconductor sensor structure according to claim 1, wherein the semiconductor body in the sensor area has a thickness of between 2 µm and 50 µm or between 2 µm and 30 µm.

5. The semiconductor sensor structure according to claim 4, wherein, in the sensor area, the ratio of the thickness to length of the semiconductor body comprises a range of between 0.6 to 1.4 or a range of between 0.8 to 1.2.

6. The semiconductor sensor structure according to claim 1, wherein the semiconductor layer has regions of a second conductivity type outside the Hall sensor structure.

7. The semiconductor sensor structure according to claim 6, wherein the first conductivity type is a p type and the second conductivity type is an n type or vice versa.

8. A semiconductor sensor structure manufacturing method for manufacturing a semiconductor structure comprising a first semiconductor wafer, a second semiconductor wafer, and an insulating layer, the method comprising:

providing, in a first process section area, at least three heavily doped semiconductor contact areas of a first conductivity type, by implantation on a first semiconductor wafer having a semiconductor layer of the first conductivity type with a front side and a backside, in a plurality of process steps on the front side and a first terminal contact is arranged on each contact area;

providing, in a second process section area, an integrated circuit having at least one metal terminal contact on the front side, on the second semiconductor wafer having a substrate layer with a backside and a front surface in a plurality of process steps on the front side;

joining, in a third process section area, the front side of the first semiconductor wafer and the front side of the second semiconductor wafer to the insulating layer such that, after the joining, the insulating layer is formed between the first semiconductor wafer and the second semiconductor wafer such that due to the joining, the backside of the first semiconductor wafer forming a top side of the semiconductor sensor structure and the backside of the second semiconductor wafer forming a bottom side of the semiconductor sensor structure, and the front side of the first semiconductor wafer and the front side of the second semiconductor wafer each become a buried surface;

thinning, in a fourth process section area, the backside of the first semiconductor wafer, and after thinning, at least three heavily doped semiconductor contact areas of the first conductivity type are produced by implantation in a plurality of process steps on the thinned backside, and a second terminal contact is arranged on each contact area, wherein, in a projection perpendicular to the front side, the first terminal contacts are offset relative to the second terminal contacts and the first terminal contacts and the second terminal contacts have a multiple rotational symmetry with respect to an axis of symmetry standing vertically on the front side and on the backside of the semiconductor body;

forming, in a fifth process section area, a trench structure completely surrounding the sensor area on the backside of the semiconductor layer; and forming a trench, in a sixth process section area, in a portion of the first semiconductor wafer lying outside the sensor area and in a projection perpendicular to the backside of the first semiconductor wafer above the first terminal contacts of the Hall sensor structure and above the terminal contacts of the integrated circuit, the trench extending from the backside of the first semiconductor wafer towards the respective terminal contact is filled with an electrically conductive material.

9. The semiconductor sensor structure manufacturing method according to claim 8, wherein the fourth process section area is carried out before or after the third process section area.

10. The semiconductor sensor structure manufacturing method according to claim 8, wherein, in the fourth process section area, a semiconductor layer having a thickness of between 2 μm and 50 μm or of between 2 μm and 30 μm is formed by a CMP process.

11. The semiconductor sensor structure manufacturing method according to claim 8, wherein a doped polysilicon is deposited and patterned during the first process section area for connecting the heavily doped contact areas to the first terminal contacts.

12. The semiconductor sensor structure manufacturing method according to claim 11, wherein the patterned polysilicon is covered by a dielectric.

\* \* \* \* \*